United States Patent [19]

Daikoku et al.

[11] Patent Number: 4,897,762
[45] Date of Patent: Jan. 30, 1990

[54] COOLING SYSTEM AND METHOD FOR ELECTRONIC CIRCUIT DEVICES

[75] Inventors: Takahiro Daikoku, Ushiku; Ryuichi Takagi, Tokyo, both of Japan

[73] Assignee: Hitachi, Ltd., Tokyo, Japan

[21] Appl. No.: 221,098

[22] Filed: Jul. 19, 1988

[30] Foreign Application Priority Data

Jul. 22, 1987 [JP] Japan .................. 62-181028

[51] Int. Cl.$^4$ .............................................. H05K 7/20
[52] U.S. Cl. ..................... 361/382; 165/80.4; 174/15.1; 174/16.1; 357/82; 361/383; 361/384; 361/385
[58] Field of Search ............... 165/80.3, 80.4, 104.33; 174/15 R, 15 CA, 16 R, 15 HS; 357/81, 82; 361/381, 382, 384–386, 388

[56] References Cited

U.S. PATENT DOCUMENTS

| | | | |
|---|---|---|---|
| 2,412,989 | 12/1946 | Kotterman | 361/384 |
| 2,906,103 | 9/1959 | Saltzman | 174/15 R |
| 4,485,367 | 11/1984 | Hashizume | 174/15 R |

FOREIGN PATENT DOCUMENTS

| | | | |
|---|---|---|---|
| 0091733 | 10/1983 | European Pat. Off. | 361/381 |
| 56-031743 | 7/1981 | Japan . | |
| 61-247061 | 4/1986 | Japan . | |

Primary Examiner—Gregory D. Thompson
Attorney, Agent, or Firm—Antonelli, Terry & Wands

[57] ABSTRACT

In a system for cooling electronic circuit devices to be tested, e.g., LSIs a cooling fluid is sprayed against the cooling surface of an electronic circuit device to cool the device, and also air is supplied in the opposite direction to the flow of the cooling fluid to form an air curtain, thereby preventing the cooling fluid from depositing on the electric circuitry of the devices.

7 Claims, 2 Drawing Sheets

COOLING SYSTEM AND METHOD FOR ELECTRONIC CIRCUIT DEVICES

BACKGROUND OF THE INVENTION

The present invention relates to a system and method for cooling electronic circuit devices such as large scale integration chips (LSICs) and, more particularly, to a cooling system and method for electronic circuit devices which are well suited for maintainin the temperatures of a large number of such devices to be tested in a highly accurate temperature range and stably cooling the devices at all times.

Known cooling systems of this type as shown in Japanese Patent Publication No. A-61-247061 are such that air is directly blown against the surface of electronic circuit devices by a fan or the like to suppress any increase in the temperature of the devices due to their heat generation. In recent years, however, there has been the advancement in the field of electronic circuit devices, particularly semiconductor integrated circuits, etc., toward increasing the degree of integration and the level of power dissipation, and thus it has become impossible to fully cool such devices. As a result, the use of low temperature air in place of the room temperature air has been proposed. However, the production of low temperature air not only requires large-scale equipment but also causes moisture condensation in the system, thus creating a concern over deterioration of the electric insulation, etc.

Japanese Patent Publication No. 56-31743 has proposed a method in which in order to enhance the cooling properties, the cooling of an LSI (large scale integration) chip is effected by pressing against it a cooling plate which is cooled by water or the like.

If this conventional technique is used in the air, even if the contacting surfaces of the cooling plate and an electronic circuit device have been finished with a high degree of accuracy to reduce the surface roughness and warpage to less than several μm, the thermal resistance between the contacting surfaces is still high due to the fact that the thermal conductivity of air is low and it is impossible to increase the contact surface load. Also, any slight change in the surface roughness or warpage causes the contact thermal resistance to vary considerably. As a result, it is difficult to cool a device to be subjected to the evaluation of characteristics or the screening while maintaining its temperature with a high degree of accuracy. Still further, the surface of the cooling plate will be damaged when a large number of devices are tested successively. Thus, the above-mentioned method is also disadvantageous from the standpoint of always cooling the devices stably.

SUMMARY OF THE INVENTION

It is an object of the present invention to provide a cooling system so designed that a cooling fluid having excellent heat transfer properties is sprayed against an electronic circuit device so as to maintain the temperature of the device with a high degree of accuracy and always cool it stably.

It is another object of the invention to provide a cooling system capable of spraying a cooling fluid against an electronic circuit device to cool it and also capable of preventing the cooling fluid from flowing to the electric circuitry of the electronic circuit device.

To accomplish the above objects, in accordance with one aspect of the invention there is thus provided a cooling system for electronic circuit devices including first fluid spraying means for spraying a first fluid against the cooling surface of an electronic circuit device, and second fluid supply means for supplying a second fluid so as to surround the spray of the first fluid and flow in the opposite directionR to the flow of the first fluid.

In accordance with another aspect of the invention there is provided a cooling system for electronic circuit devices including a substrate for holding an electronic circuit device, a member arranged to surround the electronic circuit device with a gap being defined therebetween, first fluid spraying means for spraying a first fluid against the cooling surface of the electronic circuit device to cool it, and second fluid supply means for supplying a second fluid to the first fluid side through the gap from the opposite direction to the spray direction of the first fluid.

In accordance with still another aspect of the invention, cooling for the electronic circuit devices utilizes first fluid spraying means for spraying a first fluid against the cooling surface of an electronic circuit device to cool it, and second fluid supply means for supplying a second fluid so as to substantially surround at least a portion of the spray of the first fluid and flow in the opposite direction to the flow of the first fluid.

Other objects, features and advantages of the invention will become apparent from the following description taken in conjunction with the accompanying drawings.

DESCRIPTION OF THE PREFERRED EMBODIMENT

Figure 1:
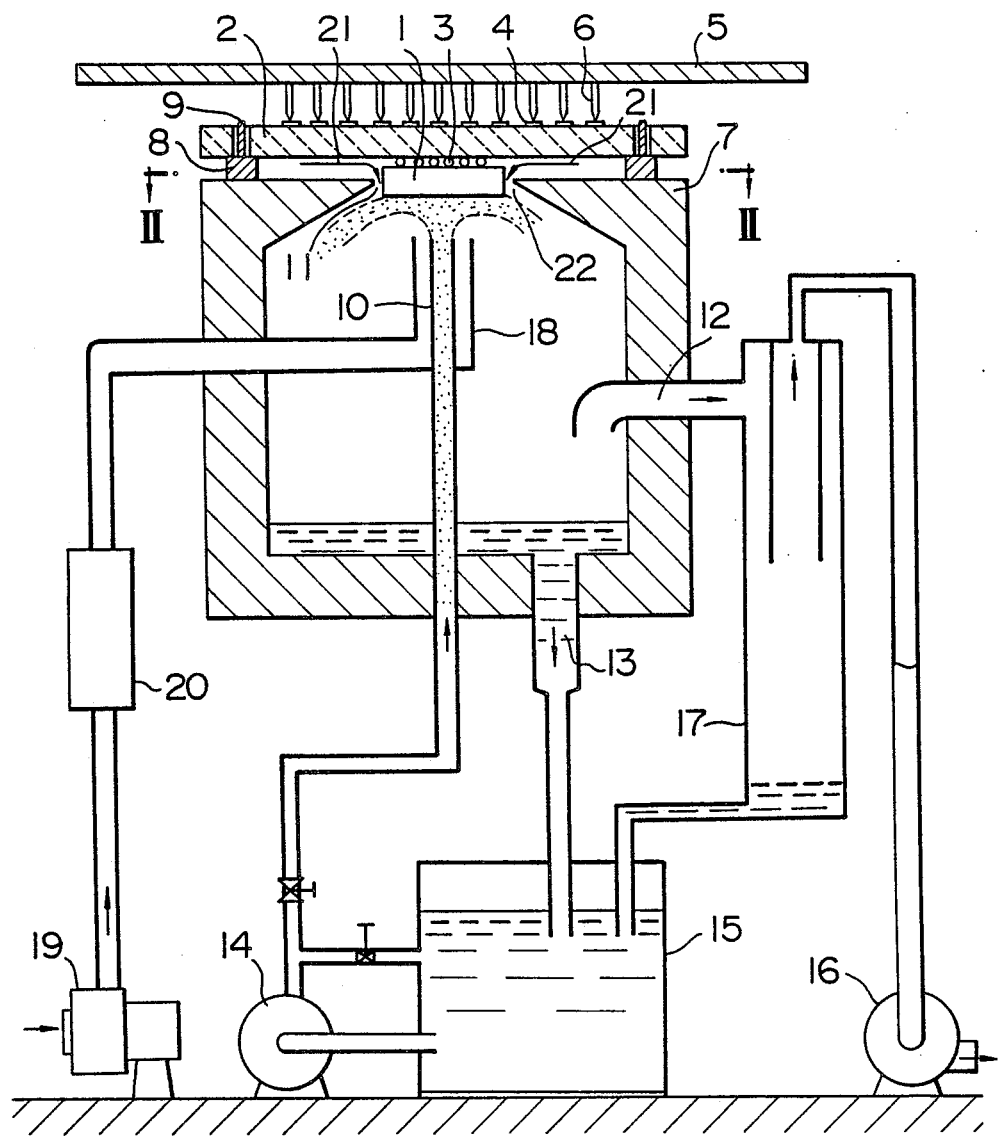
FIG. 1 is a longitudinal sectional view showing an embodiment of the present invention.
Figure 2:
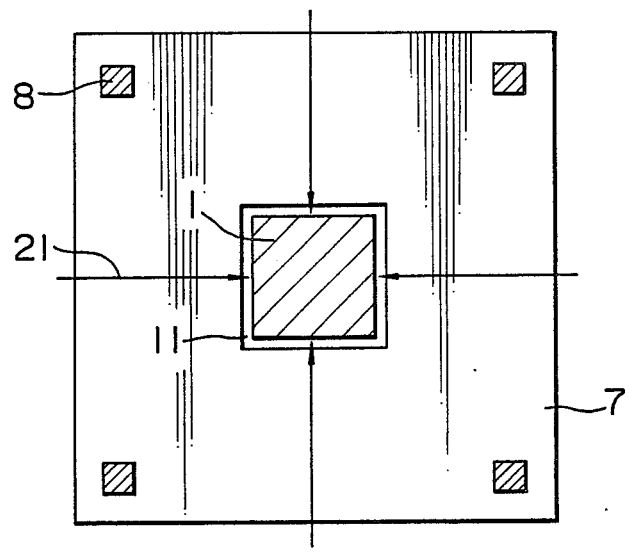
FIG. 2 is a view looked in the direction of the arrowed line II—II of FIG. 1.

Referring to FIGS. 1 and 2, numeral 1 designates an electronic circuit device, particularly a semiconductor integrated circuit or semiconductor package (hereinafter generally referred to as a chip), 2 a ceramic substrate (hereinafter simply referred to as a substrate) connected by the process of CCB controlled collapse bonding) to the chip 1 with very small solder balls 3, 4 pads for effecting the supply of electric power and the inputting and outputting of signals for the chip 1, 5 a printed wiring board including a large number of probes 6 for contacting with the pads 4 to make electric connections therewith, 7 a supporting member for holding the substrate 2, 8 protuberant spacers for admitting the flow of air between the substrate 2 and the supporting member 7, 9 pins for positioning the substrate 2, 10 a first fluid spraying nozzle for cooling the chip 1, 11 a gap formed around the chip 1 in the upper surface of the supporting member 7, 12 an air suction port formed through the supporting member 7 to maintain lower pressure within the chamber defined by the supporting member 7 than the pressure outside the chamber, 13 an outlet port for the first fluid, 14 a cooling fluid pump, 15 a thermostatic chamber for maintaining the cooling fluid at a constant temperature, 16 a blower, 17 an air-fluid separator, 18 a hot air spraying nozzle for drying the cooling fluid deposited on the chip 1, 19 a hot air blower, 20 an air heater, and 21 arrows showing the directions of flow of the air sucked into the gap 11.

In accordance with this embodiment, when evaluating the characteristic properties of the chip 1 or when screening chips to separate them into non-defective and reject chips, as in the case of FIG. 1, the chip 1 is set to face downward so as to form the gap 11 with the supporting member 7, and the cooling fluid held at a constant temperature is sprayed against the chip 1 through the cooling fluid spraying nozzle 10 by the pump 14 from the thermostatic chamber 15. Thus, the temperature of the chip 1 can be maintained in a predetermined range. To prevent the cooling fluid issuing from the nozzle 10 from reaching the undesired portions other than the cooling surface of the chip 1, when the air is discharged by the blower 16 through the air-fluid separator 17 from the air suction port 12 formed through the supporting member 7, the normal-temperature normal-moisture air on the outside of the system shown in FIG. 1 passes through the gap between the substrate 2 and the supporting member 7 as shown by the arrows 21 and it flows through the gap 11 between the chip 1 and the supporting member 7. In this case, a so-called air curtain 22 is formed around the chip 1 so as to envelope it. Since the flow directions of the air curtain 22 and the sprayed fluid are selected opposite to each other, the stream of the cooling fluid sprayed against the chip 1, the splash of the fluid, the steam of the fluid, etc., are washed away downwardly by the air curtain 22. As a result, the cooling fluid is prevented from flowing to the electric circuitry of the chip 1, the electric circuitry of the substrate 2 and the printed wiring board 5, all of which are above the supporting member 7.

In order to allow the action of the air curtain to take place effectively and thereby prevent the cooling fluid from running out to the outside through the gap 11 between the chip 1 and the supporting member 7, the cooling surface of the chip 1 is projected internally (downwardly in the Figure) of the supporting member 7 below its opening surface (the portion of the gap 11) or the side wall surface at the gap 11 is formed into an inclined surface to have an opening area which is flaringly greater than the opening surface.

By selecting the bore diameter of the cooling fluid spraying nozzle smaller than the size of the cooling surface of a chip, it is possible to control the flow velocity of an air curtain at a relatively small value. Further, in the case of the present embodiment, the atmospheric air is drawn into the supporting member 7 through the gap (opening) 11 thereby forming an air curtain so that the internal pressure of the supporting member 7 is below the atmospheric pressure outside the supporting member 7, and a force acts to press the substrate 2 against the supporting member 7. This force has the effect of preventing the chip 1 from being blow off by the flow of the cooling fluid from the spraying nozzle 10 and of firmly holding the chip 1 in place relative to the supporting member 7, thereby making it unnecessary to use any special fixing device. Also, no undesired force due to the spray of the cooling fluid is applied to the probes 6 disposed on the opposite side to the chip mounting surface of the substrate 1 to allow them to make electric connections to the pads 4 stably.

In addition, the use of pure water for the cooling fluid can remarkably improve the heat transfer of the chip 1. Moreover, there is no danger of contaminating the chip 1 due to the cooling water being pure water. It is to be noted that where the cooling requirements of the chip 1 are not great, the cooling fluid is supplied in dew form together with air. A so-called mist stream may be sprayed from the cooling fluid spraying nozzle 10. In this case, the injection quantity of the cooling fluid can be controlled to adjust the cooling characteristics of the chip 1. Also, there is a feature that the mist stream is lower in density than the cooling fluid stream, thus making it possible to decrease the flow velocity of the air curtain.

Figure 3:
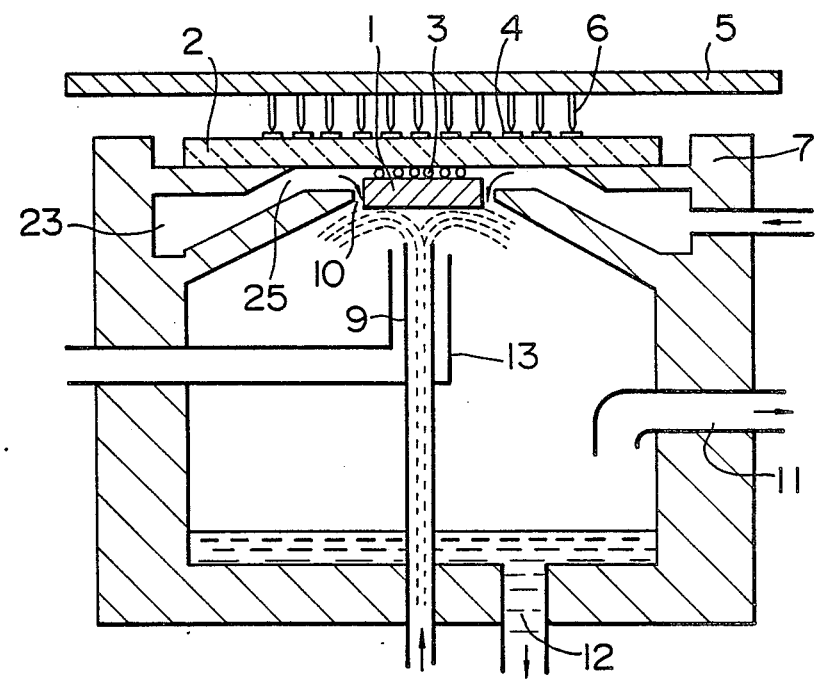
FIG. 3 is a longitudinal sectional view showing a modification of the embodiment of FIG. 1.

FIG. 3 shows a modification of the system which differs from the embodiment of FIG. 1 in that instead of forming an air curtain around the spray of the cooling fluid through the draw in of air, an air curtain is formed by supplying compressed air under pressure or by supplying air from an air blower. In this case, there are provided an air chamber 23 and an air nozzle 25 so that an uniform air curtain is formed substantially around the chip 1. The remainder is the same as in the case of FIG. 1.

While, the above-mentioned embodiments show the cases where the chip 1 is mounted facedown, the chip 1 may be mounted sideways. Further, the invention is not limited only to cooling during a properties testing process evaluation or the screening of a electronic circuit devices. It is also applicable to the cooling of ordinary electronic circuit devices. Still further, while the foregoing description is directed to cases where there is one electronic circuit device, the present invention is equally applicable to cases where a plurality of electronic circuit devices are provided.

The results of examination of the performance of the cooling system according to the present embodiment have shown that when pure water is sprayed from a nozzle having a bore diameter of 4 mm, the thermal resistance R between the heat transfer surface and the sprayed pure water results in 2 to 1° C./w when the nozzle outlet flow velocity is in the range between 0.1 and 0.5 m/s. If the flow velocity of air sprayed through the gap between an electronic circuit device and the supporting member is 6 m/s, it is possible to satisfactorily prevent the pure water from running out upwardly through the gap. In addition, the load applied to the device by the spray of the pure water is as small as several grams.

By virtue of the constructions shown in FIGS. 1-3, the flow of the second fluid acts to prevent the flow, splashes, steam or the like from being directed toward an electronic circuit device or a device testing measuring circuit. As a result, there is no danger of deteriorating the electric insulation of the electric circuitry. In addition, there is the effect of preventing any contamination due to the first fluid.

On the other hand, the spray of the first cooling fluid can always cool a device stably irrespective of any slight variation in the roughness or warpage in the cooling surface of the device or variation in the distance between the spraying nozzle and the device. In particular, the use of pure water for the first fluid makes it possible to effect the cooling effectively with a low-velocity spray, and the use of air for the second fluid can cause a flow of the second fluid without using any special device.

Further, as compared with the case where only the first fluid is sprayed against a heating element to cool it, the flowing of the second fluid disturbs the flow of the first fluid over the heating element and thus the heating element or the electronic circuit device can be cooled more effectively. In this way, it is possible to evaluate the characteristic properties of the electronic circuit device or perform the screening test of the device while efficiently cooling the device to a temperature within a highly accurate and stable temperature range.

From the foregoing description it will be seen that in accordance with the present invention, even the cooling heat transfer surface of an electronic circuit device involves a surface roughness or warpage of about several tens $\mu$m, the cooling performance of the spray of cooling fluid is not affected. Also, even if the distance between the cooling fluid spraying nozzle and the electronic circuit device deviates about several mm, similarly the cooling performance is practically not varied. Thus, a large number of electronic circuit devices can always be cooled stably so as to maintain them within a highly accurate temperature range even if the mounting accuracy of the devices is not so good.

We claim:

1. A cooling system for at least one electronic circuit device having a surface to be cooled comprising:
    first means for spraying a liquid against the surface of the at least one electronic circuit device; and
    second means for supplying a gas so as to substantially surround at least a portion of a spray of said liquid and to flow in a direction opposite to the flow of said liquid to prevent said liquid from flowing into contact with circuitry associated with said device.

2. A cooling system according to claim 1, wherein said at last one electronic circuit device is either one of an LSI chip or an LSI package, and wherein said liquid is pure water and said gas is air.

3. A cooling system for at least one electronic circuit device having a surface to be cooled comprising:
    a substrate for operatively holding the at least one electronic circuit device in relation to the cooling system;
    a member arranged around the at least one electronic circuit device to define a gap;
    spraying means on a side of the gap for spraying a first fluid against the surface of the at least one electronic circuit device; and
    supply means on an opposite side of the gap for supplying a second fluid through said gap in a direction opposite to a spray direction of said first fluid to prevent said first fluid from flowing into contact with circuitry associated with said device.

4. A cooling system for at least one electronic circuit device having a surface to be cooled, comprising:
    a substrate for holding the at least one electronic circuit device;
    a supporting member operatively arranged to support said subtrate and to form a gap around the at least one electronic circuit device;
    a substantially cloed space defined by said supporting member and the surface of the at least one electronic circuit device;
    spraying means for spraying a cooling fluid against the surface of the at least one electronic circuit device;
    an air chamber formed around the at least one electronic circuit device to pass outside air thereinto; and
    means for maintaining a lower pressure within said substantially closed space then a pressure outside said substantially closed space.

5. A cooling system for at least one electronic circuit device having a surface to be cooled, comprising:
    a substrate for holding the at least one electronic circuit device;
    a supporting member arranged to support said substrate and to form a gap around the at least one electronic circuit device;
    spraying means for spraying a cooling fluid against the surface of the at least one electronic circuit device; and
    an air chamber formed around the at least one electronic circuit device for discharging high-pressure air through said gap in a direction opposite to the flow of said cooling fluid to prevent said fluid from flowing into contact with circuitry associated with said device.

6. A cooling method for at least one electronic circuit device having a surface to be cooled, comprising the steps of:
    spraying liquid against the surface of the at least one electronic circuit device; and
    supplying gas in a direction opposite to the flow of said liquid so as to substantially surround at least a portion of the spray of said liquid to prevent said liquid from flowing into contact with circuitry associated with said device.

7. A cooling method for at least one electronic circuit device having a surface to be cooled, comprising the steps of:
    spraying a cooling fluid against the surface of the at least one electronic circuit device to cool the device; and
    supplying air simultaneously with said cooling fluid in a direction opposite to the flow of said cooling fluid so as to substantially surround at least a portion of said cooling liquid and thereby form an air curtain to prevent said cooling fluid from flowing into contact with circuitry associated with said device.

* * * * *